United States Patent
Burnsed et al.

(10) Patent No.: US 12,356,808 B2
(45) Date of Patent: Jul. 8, 2025

(54) APPARATUS AND METHOD FOR A VISION SYSTEM HAVING A BORDERLESS CHIP DESIGN

(71) Applicant: L3Harris Technologies, Inc., Melbourne, FL (US)

(72) Inventors: Jon D. Burnsed, Tempe, AZ (US); Jacob J. Becker, Gilbert, AZ (US)

(73) Assignee: L3HARRIS TECHNOLOGIES, INC., Melbourne, FL (US)

( * ) Notice: Subject to any disclaimer, the term of this patent is extended or adjusted under 35 U.S.C. 154(b) by 529 days.

(21) Appl. No.: 17/514,917

(22) Filed: Oct. 29, 2021

(65) Prior Publication Data

US 2023/0134188 A1    May 4, 2023

(51) Int. Cl.
*H10K 59/13* (2023.01)
*G02B 23/12* (2006.01)
*G02B 27/01* (2006.01)
*H01J 43/08* (2006.01)

(52) U.S. Cl.
CPC ............ *H10K 59/13* (2023.02); *G02B 23/12* (2013.01); *G02B 27/0101* (2013.01); *H01J 43/08* (2013.01)

(58) Field of Classification Search
CPC ........ H10K 59/13; H10K 59/90; G02B 23/12; G02B 27/0101; G02B 13/16; H01J 43/08
See application file for complete search history.

(56) References Cited

U.S. PATENT DOCUMENTS

| 6,798,578 B1 * | 9/2004 | Beystrum ................ H04N 5/33 345/9 |
| 9,097,891 B2 | 8/2015 | Border et al. |
| 2004/0196566 A1 | 10/2004 | Beystrum et al. |
| 2013/0342474 A1 | 12/2013 | Sultenfuss et al. |

(Continued)

FOREIGN PATENT DOCUMENTS

| WO | 2004/002143 | 12/2003 |
| WO | 2007/049213 | 5/2007 |

OTHER PUBLICATIONS

U.S. Appl. No. 16/868,306 dated May 6, 2020.
European Search Report received for EP Patent Application No. 22203215.3, mailed on Mar. 7, 2023, 8 pages.

*Primary Examiner* — Lin Ye
*Assistant Examiner* — Fayez A Bhuiyan
(74) *Attorney, Agent, or Firm* — NIXON & VANDERHYE P.C.

(57) ABSTRACT

An apparatus and method are provided for a night vision system including a transparent overlay display that transmit direct-view light representing an intensified image and emits display light representing a display image. The transparent overlay display is a borderless display in which the active area extends to at least one edge of the display. Data-handling circuitry is arranged within the active area, rather than being arranged along a border of the display. The data-handling circuitry may be fabricated in the active area of the display by fabricating it below opaque pixel regions that generate the display light. This borderless configuration allows partial overlap with the intensified image by eliminating opaque borders in which the data-handling circuitry is fabricated. This borderless configuration helps to minimize size, weight, and power by reducing the size of the display and eliminating the need for bulky beam splitters.

20 Claims, 11 Drawing Sheets

(56) References Cited

U.S. PATENT DOCUMENTS

| | | | |
|---|---|---|---|
| 2015/0077613 A1* | 3/2015 | Petilli | H04N 5/378 |
| 2017/0053971 A1 | 2/2017 | Sato | |
| 2019/0164715 A1* | 5/2019 | Burnsed | H01J 31/506 |
| 2019/0346680 A1* | 11/2019 | Ahmed | H10K 59/35 |
| 2020/0074603 A1* | 3/2020 | Vollmerhausen | G06T 5/50 |
| 2020/0400944 A1 | 12/2020 | Burnsed et al. | |
| 2021/0335587 A1* | 10/2021 | Smith | H01J 43/246 |
| 2021/0400944 A1 | 12/2021 | Burnsed et al. | |
| 2023/0101352 A1* | 3/2023 | LeBeau | H04N 23/671 |

* cited by examiner

APPARATUS AND METHOD FOR A VISION SYSTEM HAVING A BORDERLESS CHIP DESIGN

BACKGROUND

Night vision (NV) systems allow users to see in low-light environments without flooding the environment with visible light. Accordingly, NV systems can be used for covert vision in low-light environments. By enabling sight without illumination in the visible or other spectra, NV systems protect users from being detected.

Analog NV systems function by receiving low levels of light and intensifying the received light using an image intensifier. The image intensifier has a photocathode that emits electrons in response to incident photons. The emitted electrons are accelerated through a vacuum tube and directed towards a microchannel plate that amplifies the signal by multiplying the number of electrons. The multiplied electrons then strike a phosphor screen, and, via the phenomenon of luminescence, the phosphor screen emits photons in response to radiant energy (e.g., the electrons). The luminescent light from the phosphor screen is coupled through a series of optics to the user. For example, the luminescent light may be coupled through an inverting fiber optic to an eyepiece where the user can view the illuminated phosphor screen, thus allowing the user to see the objects.

Analog NV systems can include an overlay display that transmits a direct-view, intensified image through the overlay display and emits display light representing a display image from the overlay display to thereby generate a combined image with the display image superimposed over the direct-view, intensified image. The overlay display can be used to convey various information to the user, such as temperatures, distances, indicators marking objects, situational awareness messages, messages from other users, etc.

A challenge of adding an overlay display to analog NV systems is that the overlay display can increase the size, weight, and power of the analog NV systems. Accordingly, improved analog NV systems and overlay displays are desired to minimize the increase in size, weight, and/or power.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes an optical device that includes a semiconductor chip having a first surface that receives direct-view light and transmits the direct-view light through transparent regions. The optical device further includes a plurality of electro-optical circuits formed on the semiconductor chip. The plurality of electro-optical circuits formed on the semiconductor chip, the plurality of electro-optical circuits comprising light emitters spanning an active area that extends to one or more edges of the semiconductor chip, the light emitters configured to output display light, and the transparent regions being arranged between the respective light emitters.

Another embodiment illustrated herein is a method of processing light in an intensifier module. The method includes receiving, at an intensifier, light from an environment and generating intensified light representing an intensified image of the environment. The method further includes transmitting the intensified light through a transparent overlay display. The method further includes emitting display light from the transparent overlay display, the display light superimposing a display image over the intensified image. The transparent overlay display includes a semiconductor chip having a first surface that receives intensified light and transmits the intensified light through the transparent regions of the optical device. The transparent overlay display further includes a plurality of electro-optical circuits formed on the semiconductor chip, the plurality of electro-optical circuits comprising light emitters spanning an active area that extends to one or more edges of the semiconductor chip, the light emitters configured to output the display light, and the transparent regions being arranged between the respective light emitters of the light emitters.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Figure 1A:
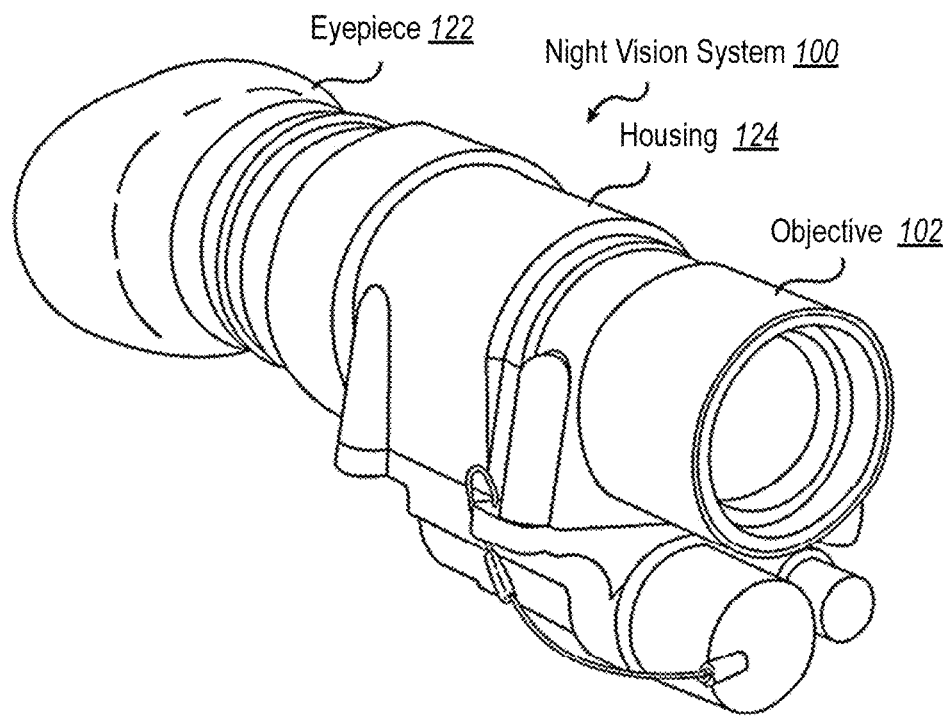
FIG. 1A illustrates a perspective view of a night vision (NV) system, according to one embodiment.

As discussed above, the improved functionality of incorporating an overlay display into the intensifier module of an analog night vision (NV) system comes at the expense of increased size, weight and power. However, the embodiments disclosed herein have the advantage of minimizing this increase in the size, weight, and/or power due to the overlay display being integrated with the analog NV system.

Size, weight, and power are each important parameters in image intensifier systems. For example, greater weight can increase the torque that a head-mounted NV system applies the human neck, potentially causing lasting damage through prolonged use. Keeping NV systems small and compact while simultaneously providing overlay display functionality presents challenges given the size of conventional displays and beam combiners that required in order to span a large portion (or all) of the cross-sectional of an intensified image. One challenge is that, for conventional displays and beam combiners, the large size of the beam combiner or display can necessitate a larger housing to hold those components.

Accordingly, the embodiments disclosed herein provide overlay display configurations having reduced size relative to other configurations (e.g., configurations using beam splitters). For example, the size of the display chip can be decreased by using a borderless display configuration. The borderless display configuration may be realized by changing the location of the addressing and readout circuitry from the border of the chip to within the active area of the display. This change in location may be realized, e.g., by adding a semiconductor circuit layer below the opaque/non-transparent regions for pixels of the overlay display. Additionally, borderless display configuration may be realized by routing communication lines to the bond pads using metallization layers below the inter-pixel top metal row/column lines. A third technique reduces the display chip size by using data-handling circuitry integrated below the active area of the chip (e.g., the opaque regions corresponding to pixels). Alternatively or additionally, a circuit configuration can be used in which some (or all) of the data-handling circuitry are coplanar with the display control circuitry driving the pixels of the overlay display. This coplanar configuration may be realized by decreasing the pixel density to allow for additional area at the respective pixels (e.g., opaque regions) that can be used for readout circuitry and other data-handling circuitry.

As discussed below, the driving circuitry for the pixels of the overlay display attenuates or blocks the direct-view, intensified light. For example, the active silicon and metallization layer(s) that are used to fabricate transistors (e.g., CMOS transistors) and other circuit elements attenuate light in the direct-view, intensified light (also abbreviated as "intensified light"). Additionally, the metallization layer(s) used to fabricate interconnect lines also attenuate the intensified light. These regions in which the intensified light is attenuated or blocked are generally referred to as opaque regions. Fabricating additional circuit elements or metal lines above or below the opaque regions does not degrade the intensified image because the additional circuit elements or metal lines only attenuate those rays of the intensified light that would be attenuated by the opaque regions. Here, the phrase "above or below the opaque regions" means that, with respect to optical paths of rays of the intensified light, the additional circuit elements lie in the same optical path(s) as opaque regions.

Additionally, the active silicon can be arranged above or below the interconnect lines because both the active silicon and the interconnect lines represent opaque regions. That is, any type of opaque region may be arranged above or below any other type of opaque region because either type of opaque region obscures or attenuates those rays of the intensified light passing through the opaque region.

Figure 1B:
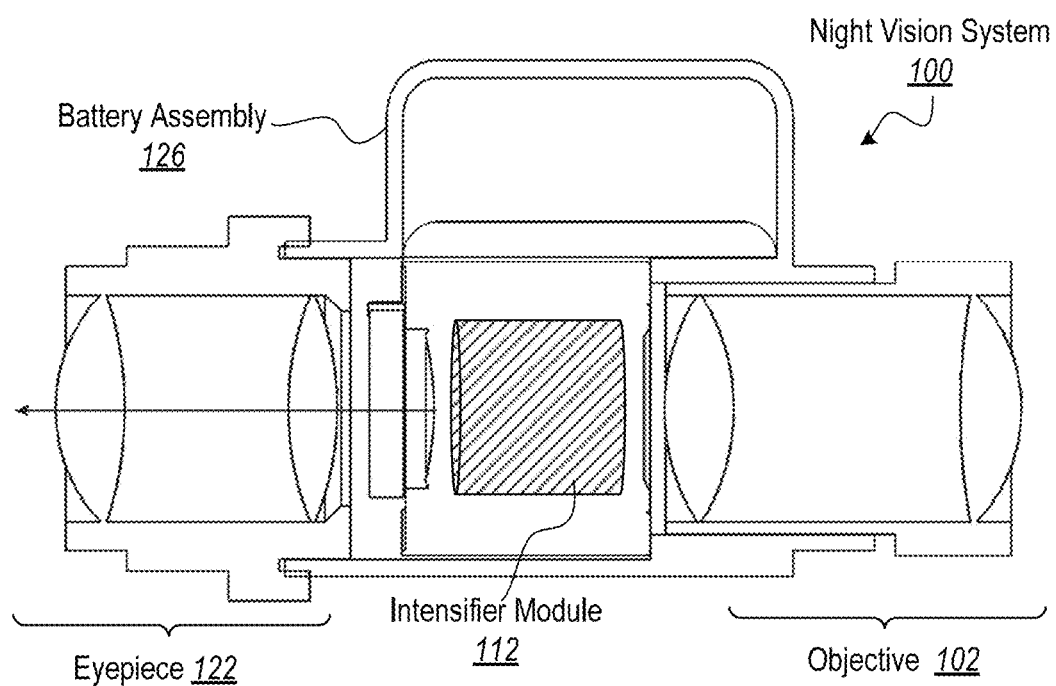
FIG. 1B illustrates a side cutaway view of the NV system, according to one embodiment.

Referring now to FIGS. 1A and 1B, a non-limiting example of a NV system is illustrated. In particular, FIGS. 1A and 1B illustrate a PVS-14 NV system 100. In the example illustrated, the NV system 100 includes a housing 124. As will be illustrated in more detail below in other figures, the housing 124 houses an image intensifier module 112. The NV system 100 further includes an objective 102 which receives light reflected and/or generated in an environment. The objective 102 includes optics such as lenses, waveguides, and/or other optical components for receiving and transmitting light to the image intensifier module 112. The NV system 100 further includes an eyepiece 122. The eyepiece 122 includes optics for focusing images created by the NV system 100 into the eye of the user.

Figure 2:
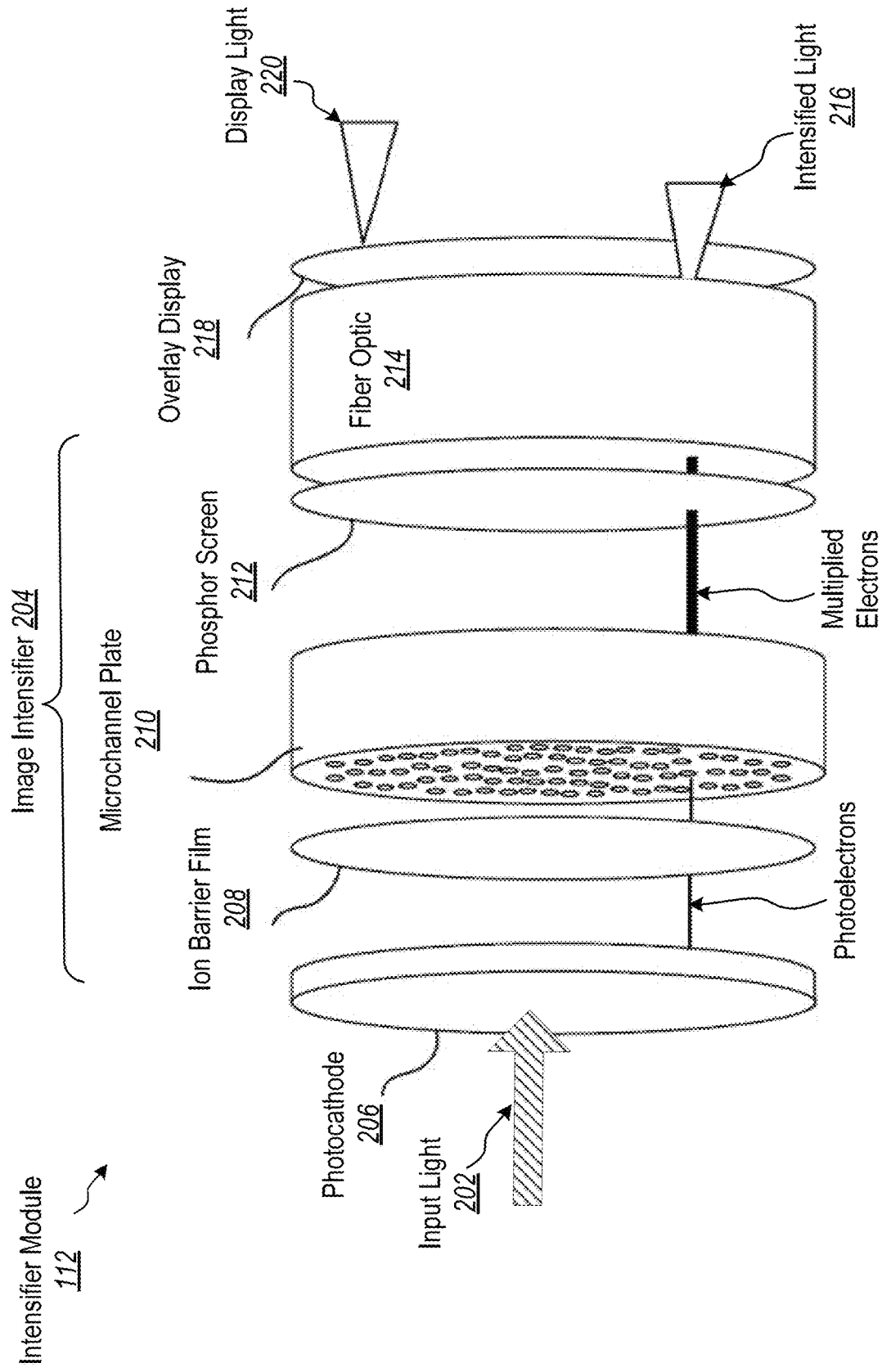
FIG. 2 illustrates a schematic diagram of an intensifier module of the NV system, according to one embodiment.

FIG. 2 illustrates the image intensifier module 112, according to one example. The image intensifier module 112 includes an image intensifier 204 without an overlay display. The light from the image intensifier module 112 is captured by the eyepiece 122 and directed to the user.

The image intensifier module 112 receives the input light 202, which has been transmitted through the objective 102 to the image intensifier module 112. The input light 202 may be, for example, dim light from a nighttime environment that would be challenging to see with the naked eye.

The objective directs the input light 202 into the image intensifier 204. The image intensifier 204 may include functionality for amplifying the received image so that the image that can be viewed by the user. In the illustrated embodiment, this amplification is accomplished using a photocathode 206, a microchannel plate 210, and a phosphor screen 212.

The photocathode 206 absorbs incident photons and outputs electrons in response. The electrons may pass through an optional ion barrier film 208. Electrons from the photocathode 206 are transmitted to the microchannel plate 210, which multiplies the number of electrons. The multiplied electrons then strike a phosphor screen 212, which absorbs the energy from electrons generating photons in response. The phosphor screen 212 converts the radiant energy of the multiplied electrons to luminescent light via the phenomenon of luminescence. Accordingly, the phosphor screen 212 glows due to electrons from the microchannel plate 210 striking the phosphor screen 212, creating an intensified image that represents the image of the input light 202. A fiber-optic element 214 carries the intensified light 216 (with the intensified image) to the eyepiece 122.

The analog NV system 100 is a direct-view imager. The analog NV system 100 generates an image directly from the input light 202 without an intervening step of the image being based on a detected/digitized image as performed in digital NV system. In contrast to the direct-view intensified image representing an intensified version of the input light 202, the overlay display 218 generates a display image which is discussed below.

Figure 3:
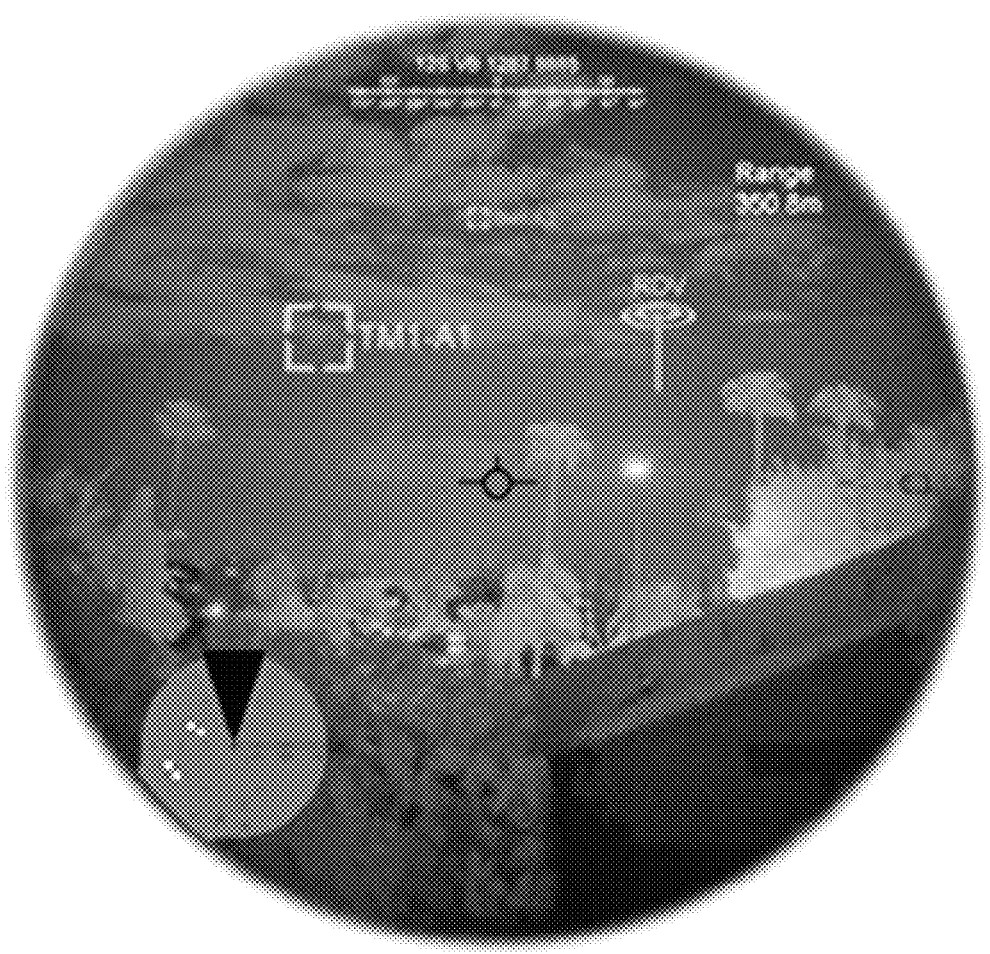
FIG. 3 illustrates an NV scene image with heads-up display functionality, according to one embodiment.

The overlay display 218 generates display light 220, which is superimposed with the intensified light 216. For example, the overlay display 218 may include functionality for displaying information to a user. Such information may include graphical content, including text, images, superimposed thermal image data and the like. FIG. 3, which is discussed below, illustrates an example of an image in which an overlay display 218 superimposes text, symbols, and other information over an intensified image that includes trees and clouds. Additional details regarding certain embodiments of the NV system 100 and the overlay display 218 are provided in U.S. patent application Ser. No. 16/868,306, filed on May 6, 2020, titled "Backside Etch Process for Transparent Silicon Oxide Technology", which is incorporated herein by reference in its entirety.

FIG. 3 illustrates an example of an image in which an overlay display 218 superimposes text and other graphical symbols over an amplified image of a nightscape that includes trees and clouds. As discussed above, the overlay display 218 may include functionality for displaying information to a user. Such information may include graphical content, including text, images, superimposed thermal image data and the like. The overlay display 218 outputs display light 220 which can be sent to the eyepiece. Thus, an image such as that illustrated in FIG. 3 is presented to the user in the NV system 100.

Figure 4A:
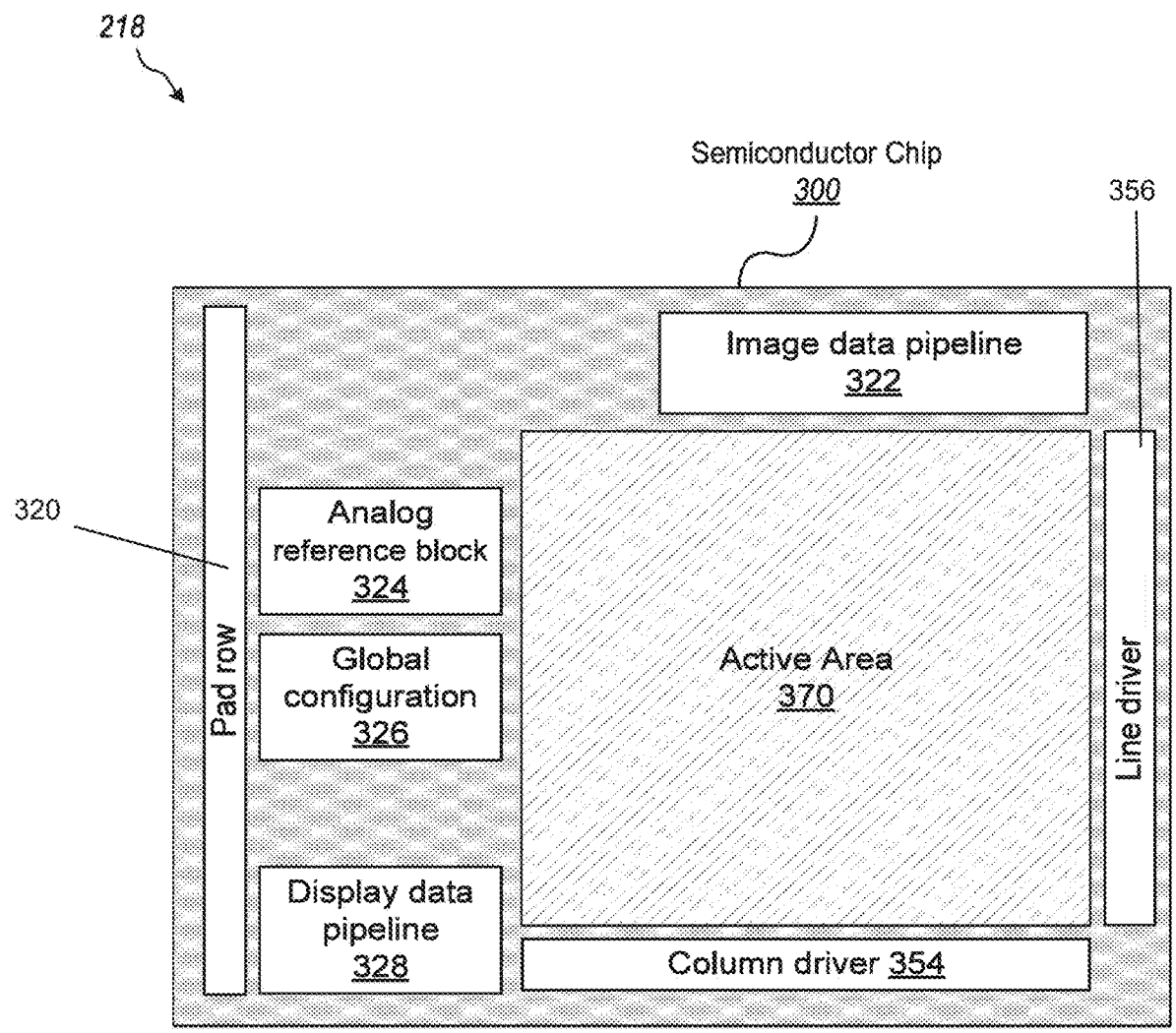
FIG. 4A illustrates a chip layout of an overlay display having a bordered configuration, according to one embodiment.
Figure 4B:
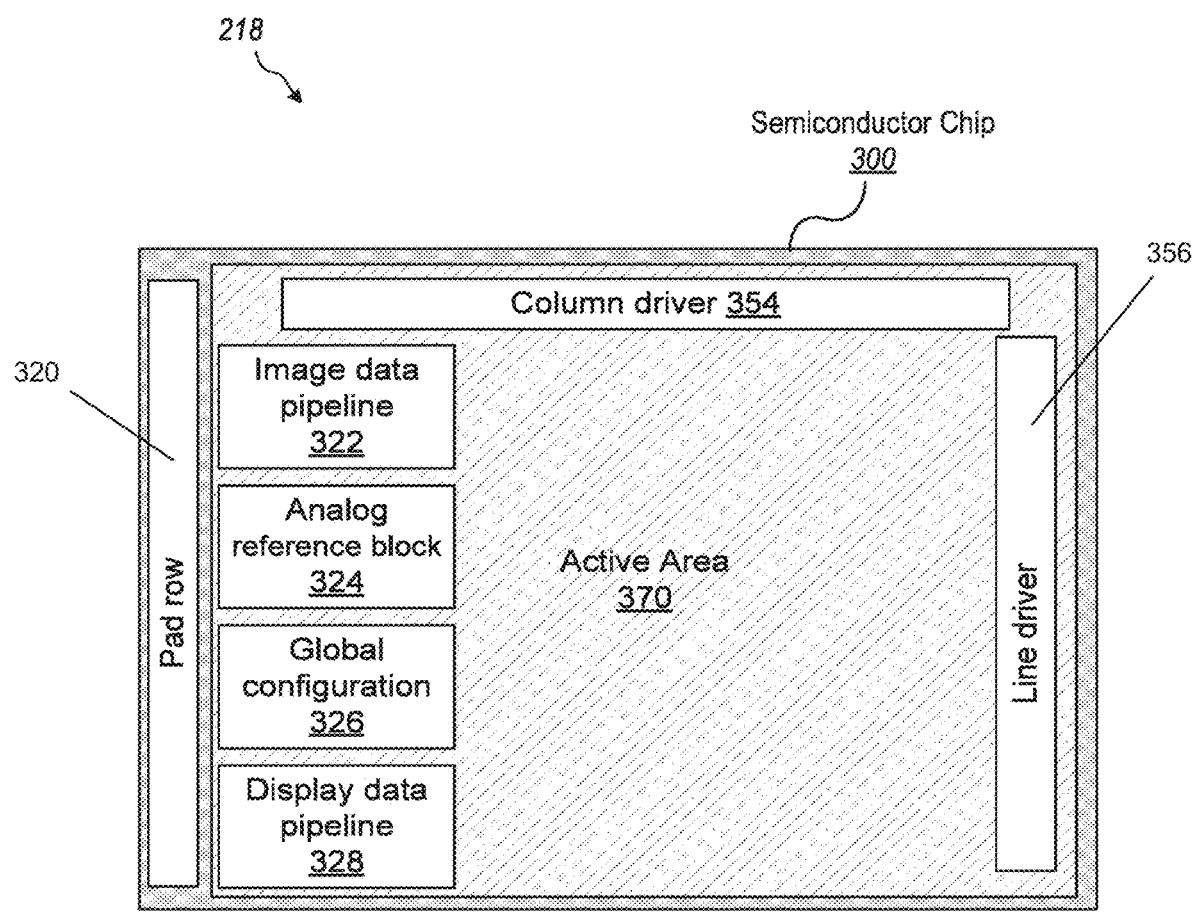
FIG. 4B illustrates a chip layout of an overlay display having a borderless configuration, according to one embodiment.

FIGS. 4A and 4B illustrate top-down views of respective layouts for the overlay display 218. In both FIGS. 4A and 4B, the overlay display 218 is fabricated on a semiconductor chip 300, and the overlay display 218 includes an active area 370 and data-handling circuitry, including, e.g., an image data pipeline 322, an analog reference block 324, a global configuration 326, a display data pipeline 328, a column driver 354, and a line driver 356. In FIG. 4B, the layout for the overlay display 218 has the data-handling circuitry within the active area 370. In FIG. 4A, the data-handling circuitry is outside the active area 370. Inside the active area 370, transparent regions are arranged between pixels, and the transparent regions transmit the intensified light 216, as discussed below with reference to FIGS. 5A and 5B. In contrast, outside the active area 370, the chip is opaque to the intensified light 216.

An advantage of having some (or all) of the data-handling circuitry within the active area, as illustrated in FIG. 4B, is that the active area 370 occupies a larger percentage of the total area of the semiconductor chip 300. Thus, the semiconductor chip 300 can be smaller because it does not require a large boundary region in which to fabricate additionally circuitry. Because the semiconductor chip 300 is smaller, a smaller housing can be used for an intensifier module that includes a borderless display.

Additionally, on one or more edges of the semiconductor chip 300, the active area 370 may extend all the way to the border/periphery of the semiconductor chip 300. For example, FIG. 4B illustrates the active area 370 extending to the border/periphery on three edges of the semiconductor chip 300. The data-handling circuitry can be arranged within the active area 370 by fabricating the data-handling circuitry below or above the display control circuitry, for example.

Additionally, in certain embodiments, the display control circuitry does not consume all the available area in the given fabrication layers in which the display control circuitry is fabricated. For example, the fabrication layers can have opaque regions and transparent regions, as discussed below with reference to FIG. 6. The display control circuitry may occupy only part of the opaque region within a given fabrication layer and the remaining part of the opaque region within the given fabrication layer may be used to fabricate some (or all) of the data-handling circuitry.

Figure 5A:
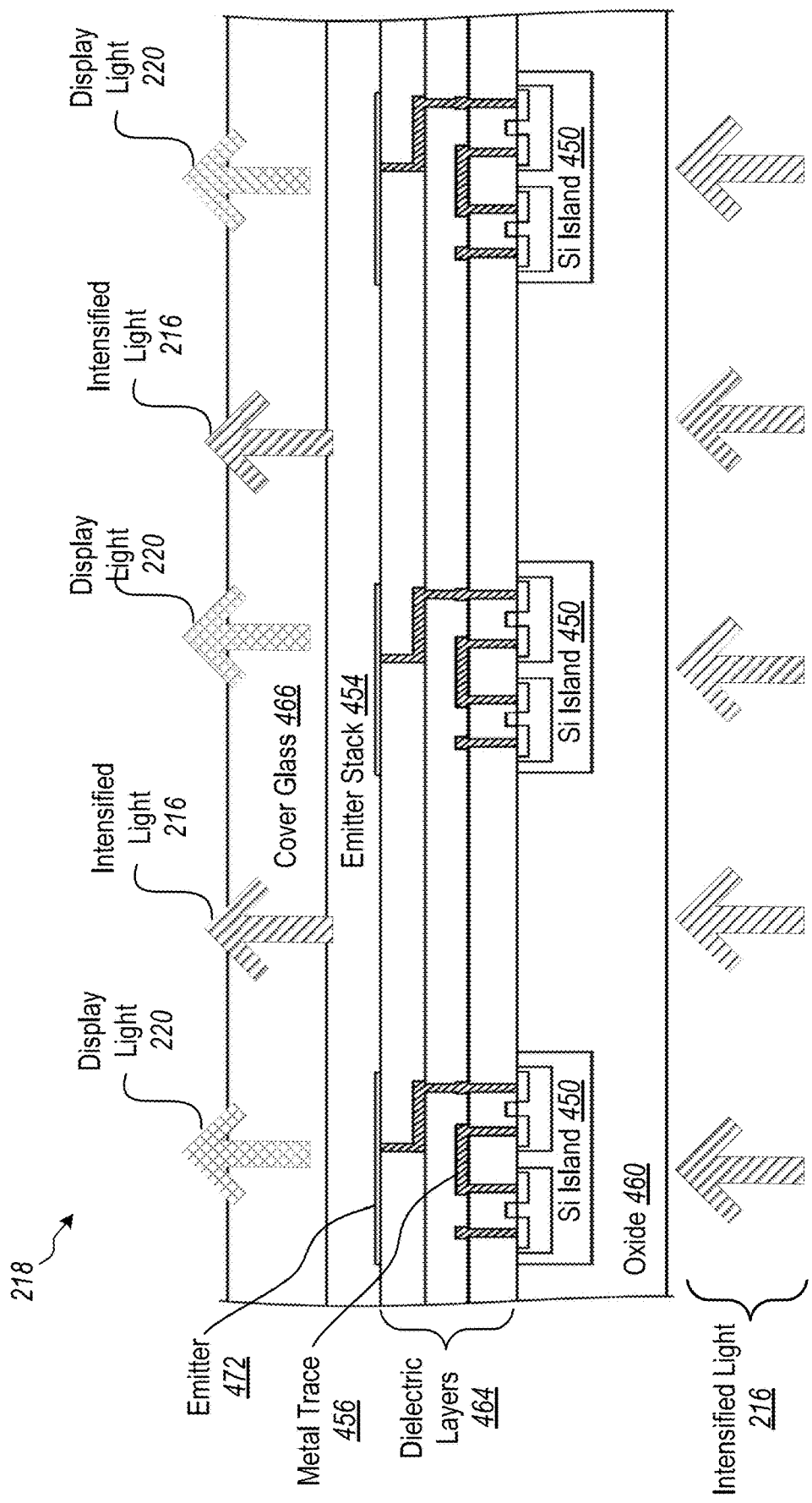
FIG. 5A illustrates a diagram of a portion of an overlay display having a single planar circuit configuration, according to one embodiment.

FIG. 5A illustrates a cross-section of a part of the overlay display 218. In certain non-limiting embodiments, the overlay display 218 may include active silicon areas, which are illustrated as active silicon islands 450 (e.g., native silicon islands). The active silicon islands 450 can be used to fabricate transistors, such as MOSFETs by doping the silicon (Si) with spatially varying concentrations of donor and acceptor atoms. Further, the MOSFETs may be fabricated using intermetal and dielectric layers 464 that include insulators (e.g., oxides and dielectrics) and metal traces 456. In certain embodiments, the MOSFETs may provide (but are not limited to providing) logic functions and/or control functions (e.g., to control turning on/off the LEDs in the emitter stack 454).

In the example illustrated in FIG. 5A, each of the active silicon islands represents a pixel of the overlay display 218. Thus, by powering various emitters 472 in the emitter stack 454 using the transistors in the active silicon islands, a display image can be created by the overlay display 218 and output to a user. In certain embodiments, the emitters 472 can be organic light emitting diodes (OLEDs). A display image is generated by outputting the display light 220. In FIG. 5A, the intensified light 216 enters the overlay display 218 from the bottom, passes through the oxide 460 and then through the other layers before exiting the overlay display 218 through the cover glass 466. The display light 220 is generated in the emitter 472 and, like the intensified light 216, the display light 220 exits through the cover glass 466. After exiting through the cover glass, both the display light 220 and the intensified light 216 are transmitted to the eyepiece 122 of the NV system 100, and then to the user.

Whereas the pixels (i.e., Si island 450, metal traces 456, and emitters 472 in the emitter stack 454) substantially attenuate the intensified light 216, transparent regions between the pixels are at least partially transparent to the intensified light 216. Accordingly, the intensified light 216 is transmitted through the transparent regions between the pixels of the overlay display 218. In contrast, the active Si islands 450 and the metal traces 456 substantially block the intensified light 216.

Figure 5B:
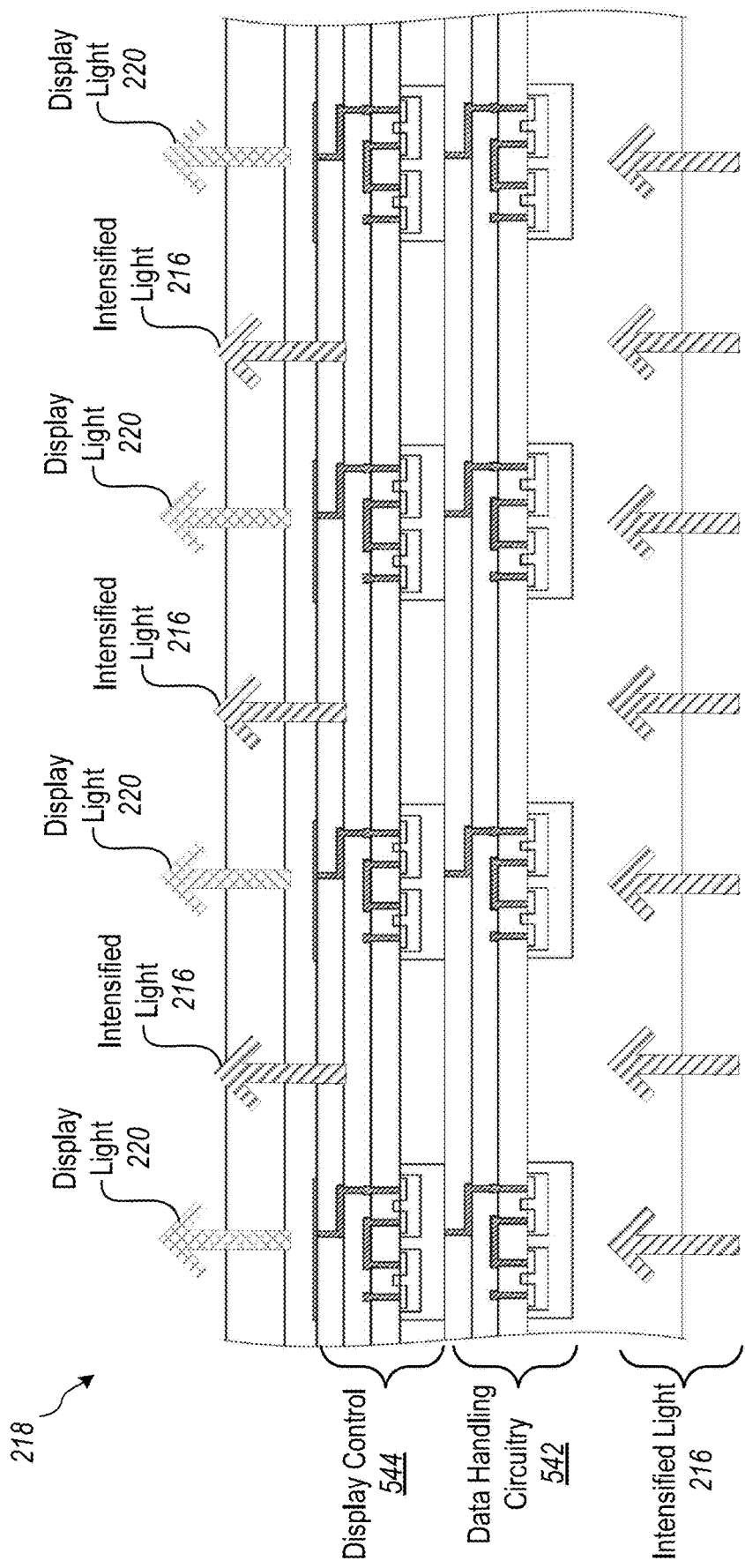
FIG. 5B illustrates a diagram of a portion of an overlay display having a two plane circuit configuration, according to one embodiment.

FIG. 5B illustrates a cross-section of a part of the overlay display 218 in which a first set of fabrication layers are provided in which to implement the display control circuitry 544 (e.g., circuitry to drive the emitters 472 and generate display light 220). A second set of fabrication layers are provided in which to implement the data-handling circuitry 542. Thus, the display control circuitry 544 and the data-handling circuitry 542 are respectively fabricated in separate circuitry planes. The display control circuitry 544 is fabricated in a first (upper) circuitry plane, and the data-handling circuitry 542 is fabricated in a second (lower) circuitry plane.

Figure 6:
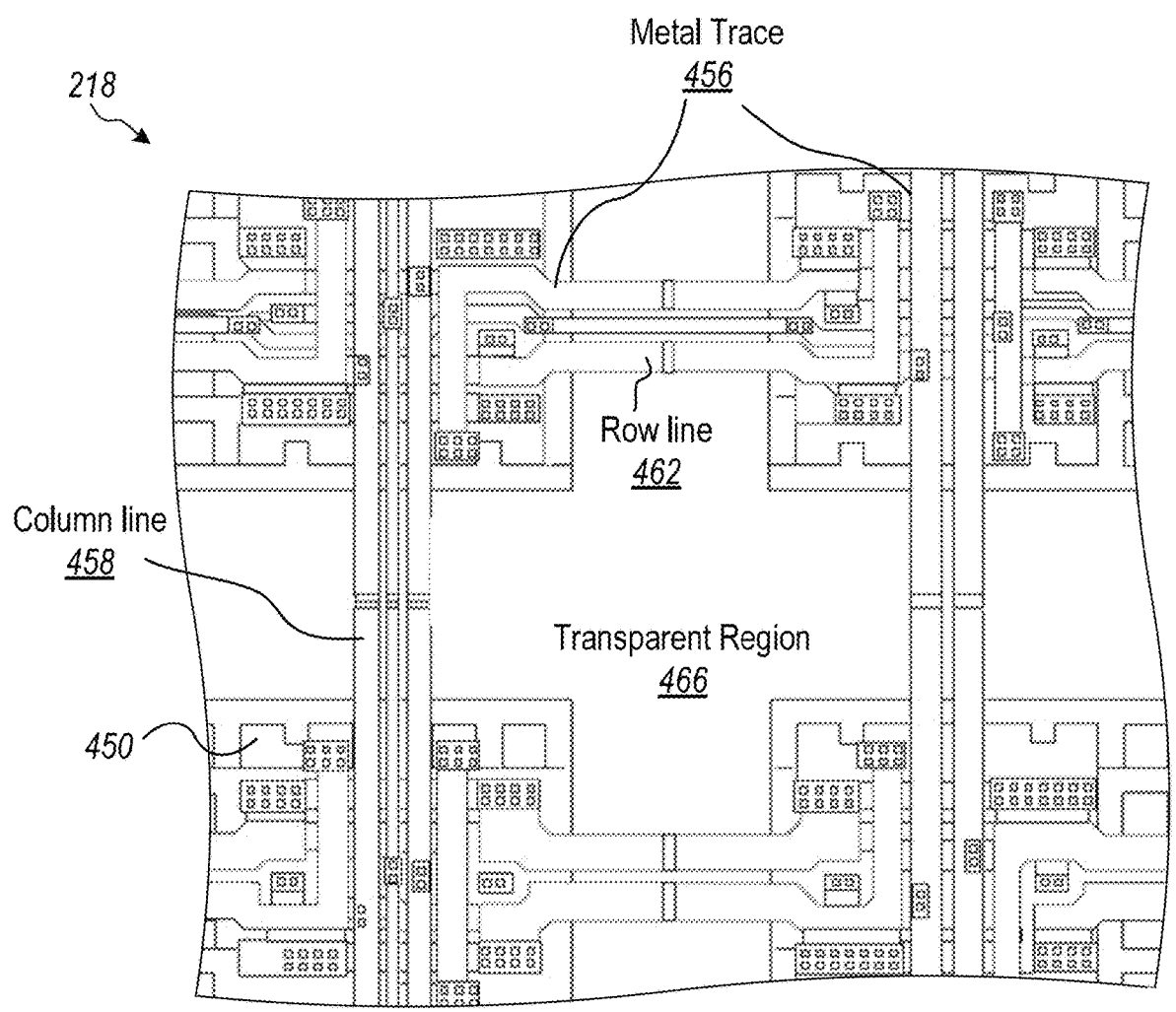
FIG. 6 illustrates a top-down view of a portion of an overlay display, according to one embodiment.

FIG. 6 illustrates a top-down view of a portion of an overlay display 218 in which the opaque regions (e.g., regions including the active Si islands 450 and metal traces 456) are configured with a transparent region 466 between the opaque regions. The active Si islands 450 and metal traces 456 may be configured to function as electronic components (such as MOSFETs) to provide logic functions and to provide control functions for the control of pixels in an overlay display 218. The active Si islands 450 and metal traces 456 substantially block the intensified light 216, but the intensified light 216 may be transmitted through the transparent region 466 between the Si islands 450 and metal traces 456. Metal traces called column lines 458 and row lines 462 run between the pixels, conveying signals addressed to the respective pixels. These lines are also opaque regions. Accordingly, in a second circuitry plane (as illustrated by the data-handling circuitry 542 in FIG. 5B) additionally opaque regions may be fabricated below the row and column lines without blocking the light transmitted through the transparent region 466. For example, in the borderless display configuration, routing communication lines to the bond pads (see pad row 320 in FIGS. 4A and 4B) may be fabricated below the inter-pixel top metal row lines 462 and column lines 458.

Returning to FIGS. 5A and 5B, the display light 220 is generated by emitters 472 (e.g., OLEDs) that are driven by the display control circuitry 544. The intensified light 216 passes through the transparent regions between the Si islands 450 and metal traces 456, and the Si islands 450 and metal traces 456 attenuate/block the intensified light 216. In FIG. 5B, the intensified light 216 would be blocked by the display control circuitry 544 even if the data-handling circuitry 542 were not present. Accordingly, the addition of the data-handling circuitry 542 below the display control circuitry 544 does not decrease the transmission of the intensified light 216 through the overlay display 218 or otherwise degrade the intensified image represented thereby.

Alternatively or additionally, the data-handling circuitry 542 may be provided above the display control circuitry 544, so long as the data-handling circuitry 542 does not block or otherwise obscure the display light 220. In certain embodiments, the data-handling circuitry 542 may be provided in a same fabrication layer as the display control circuitry 544. This configuration (in which the data-handling circuitry 542 is coplanar with the display control circuitry 544) can be realized by increasing the area of the opaque region for each pixel. Increasing the area of the opaque regions may be a more viable option for overlay displays having lower pixel densities (e.g., lower resolution pixel arrays).

The data-handling circuitry 542 may include register circuits, digital to analog converters, analog to digital converter, direct memory access circuits, shift registers, logic circuits, and other circuitry for managing, communicating, and processing input and output pixel values for the overlay display 218.

Returning to FIG. 4B, the image data pipeline 322, analog reference block 324, global configuration 326, display data pipeline 328, column driver 354, and line driver 356 are each illustrated as having one edge adjacent to an edge of the active area 370. By having one edge adjacent to an edge of the active area 370, the respective units of circuitry are allowed to communicate/route signals from within the active area to outside of the active area and vice versa. For example, units of circuitry that have an edge adjacent to an edge of the active area 370 may route signals off chip or to circuitry that is on chip but outside of the active area. The pad row 320 includes bond pads for routing electrical signals on/off the semiconductor chip 300.

An advantage of the borderless configuration illustrated in FIG. 4B is that the semiconductor chip 300 may be used in a partial overlay display without requiring a beam splitter. Here, the word "borderless" means that the active area extends all the way to the border on at least one edge of the chip—not necessarily all four edges. Here, a "border" means the area of the chip between the active area of the display and the edge of the chip, in which area circuitry may be fabricated. For example, the semiconductor chip 300 in FIG. 4B is borderless on three edges because there are no units of circuitry on three edges of the active area 370, making the display illustrated in FIG. 4B a borderless configuration.

Figure 7A:
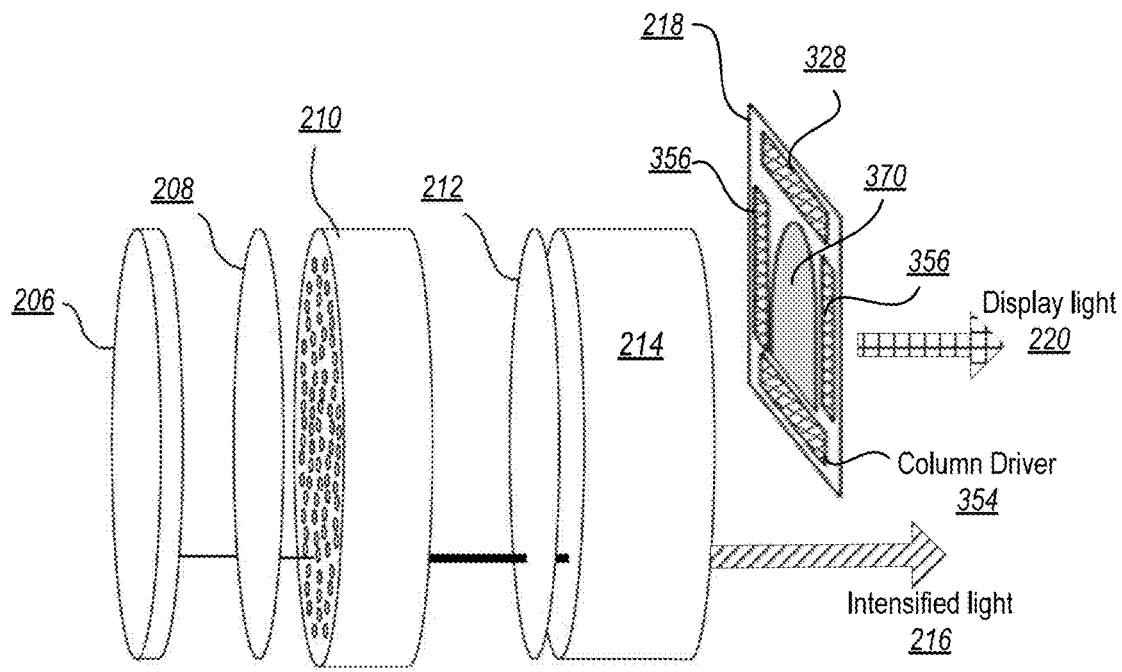
FIG. 7A illustrates a schematic diagram of an intensifier module having a partially overlapping overlay display with a bordered configuration, according to one embodiment.

In certain embodiments, the overlay display 218 may be configured to cover only part of the cross-sectional area of the intensified image (e.g., the top half of the intensified image). FIG. 7A illustrates an example in which a non-borderless overlay display 218 is used to superimpose display light over the top half of the intensified light 216. Because the column driver 354 is arranged in the middle of the cross-sectional area of the intensified light 216, part of the intensified light 216 is obscured, which is disadvantageous. This obscuring of the intensified light 216 by the border corresponding to the column driver 354 may be cured either by using a borderless configuration for the overlay display 218, as illustrated in FIG. 7C, or by using a prism/beam splitter 280, as illustrated in FIG. 7B.

Figure 7B:
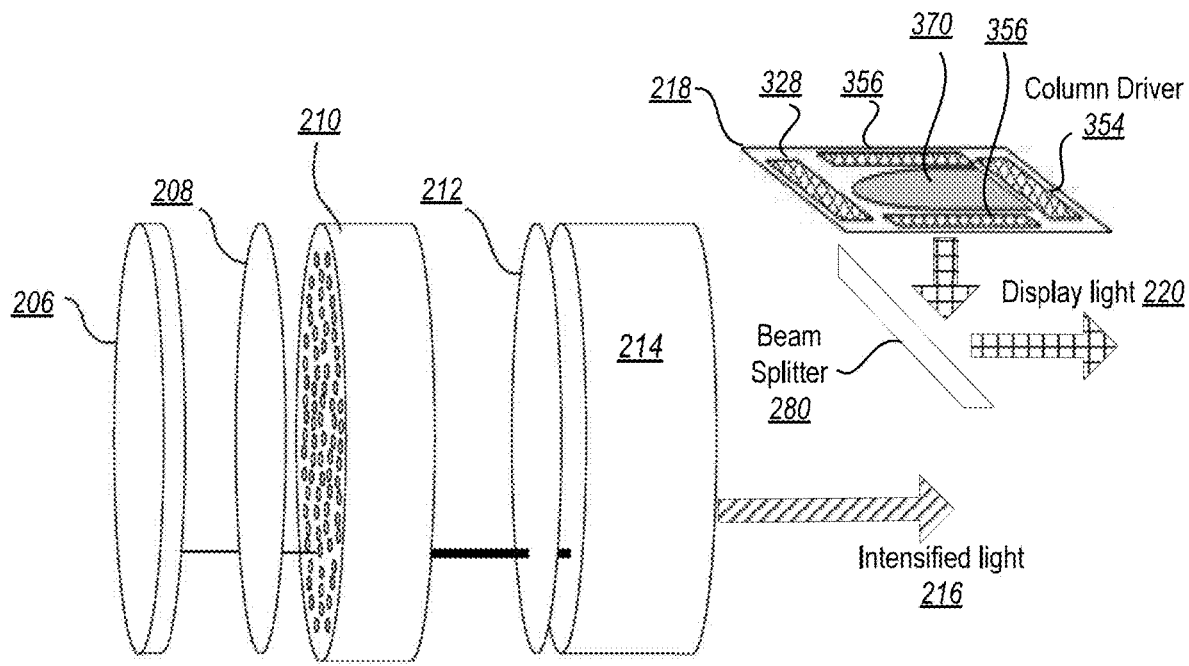
FIG. 7B illustrates a schematic diagram of an intensifier module having a partially overlapping overlay display that is superimposed over the intensified light using a beam splitter, according to one embodiment.

In FIG. 7B, the overlay display 218 is arranged outside of the optical path of the intensified light 216. Then a prism/beam splitter 280 is used to combine the display light 220 with the intensified light 216. Arranging the overlay display 218 outside of the optical path of the intensified light 216 has the drawback of increasing the overall size of the intensifier module 112. Additionally, the beam splitter 280 increases the weight and size of the intensifier module 112. These drawbacks are overcome by using a borderless overlay display 218, as illustrated in FIG. 7C.

Figure 7C:
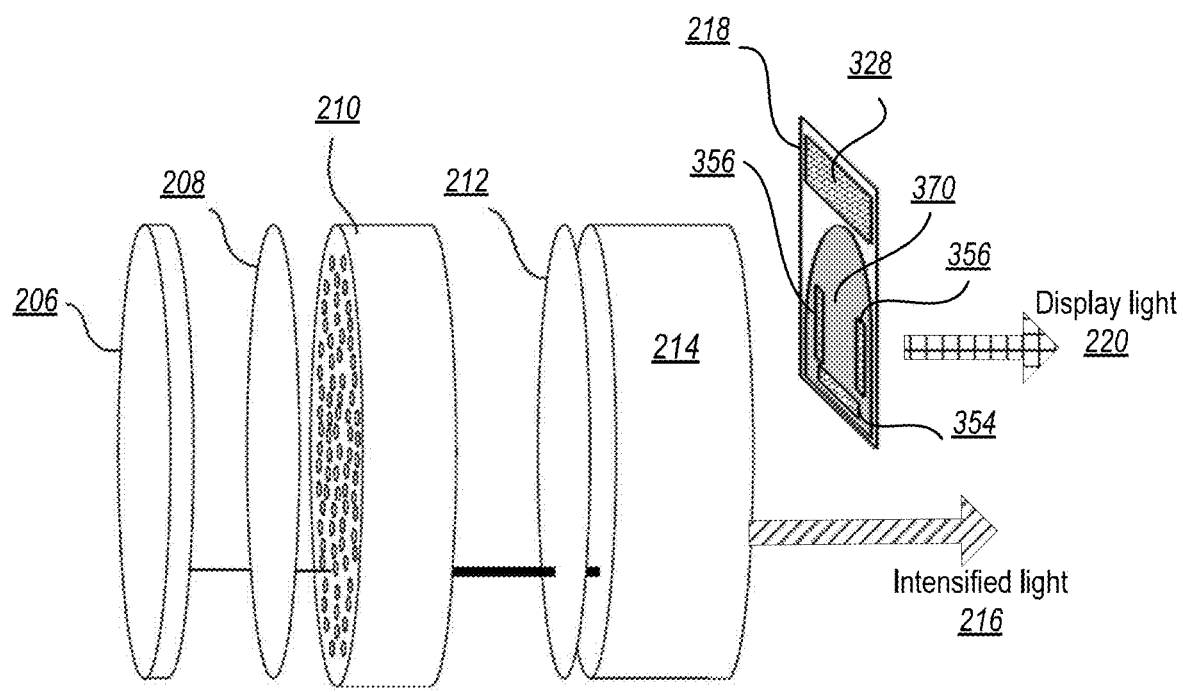
FIG. 7C illustrates a schematic diagram of an intensifier module having a partially overlapping overlay display with a borderless configuration, according to one embodiment.

In FIG. 7C, a borderless overlay display 218 is used to superimpose display light over the top half of the intensified light 216. Because the column driver 354 is within the active area 370, the active area 370 extends all the way to the bottom edge of the overlay display 218, in contrast to FIG. 7A. That is, the bottom edge of the overlay display 218 is a borderless edge that passes through an interior of the cross-sectional area of an optical path of the intensified image. Thus, there is no opaque border on the bottom of the overlay display 218 (e.g., there is no circuitry on the bottom edge of the overlay display 218), the borderless overlay display 218 does not obscure the middle of the cross-sectional area of the intensified light 216. Accordingly, the borderless configuration allows for partial overlay displays without the additional size and weight incurred by using a beam splitter and without obscuring part of the intensified light 216 due to an opaque border, as in the bordered configuration in FIG. 7A.

Figure 8:
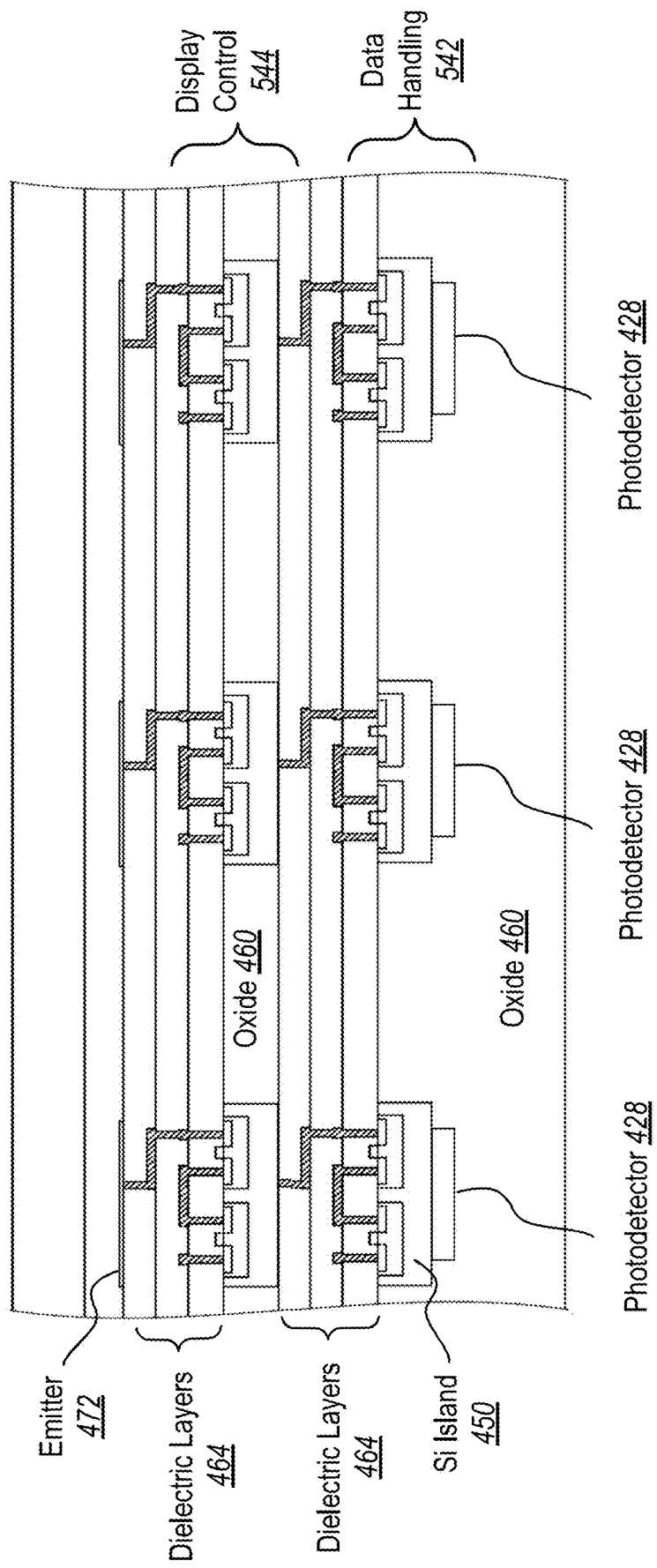
FIG. 8 illustrates a diagram of a portion of an overlay display having photodetectors, according to one embodiment.

FIG. 8 illustrates an embodiment of the overlay display 218 that includes photodetectors 428 arranged below the data-handling circuitry 542. The photodetectors 428 detect an intensity of the intensified light 216. The data-handling circuitry 542 can include a readout integrated circuit that processes and routes signals from the photodetectors 428. For example, the readout integrated circuit may route signals from the semiconductor chip 300, or the signals from the photodetectors 428 may be processed locally on the semiconductor chip 300 (e.g., to control an intensity of the display light 220).

In the examples above it should be noted that although not shown various alternatives can be implemented. For example, in any of the embodiments illustrated, a backside fill may be used or may be omitted. Alternatively, or additionally, while the active areas have been shown as being substantially square in nature, it should be appreciated that the active areas may be rectangular or other appropriate shapes.

The discussion above refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical device comprising:
    a semiconductor chip having a first surface that receives direct-view light and transmits the direct-view light through transparent regions;
    a plurality of electro-optical circuits formed on the semiconductor chip, the plurality of electro-optical circuits comprising light emitters spanning an active area that extends to one or more edges of the semiconductor chip, the light emitters configured to output display light, and the transparent regions being arranged between respective light emitters; and
    a plurality of data-handling circuits formed on the semiconductor chip, wherein at least one of the plurality of data-handling circuits comprises an edge adjacent to an edge of the active area permitting the at least one of the plurality of data-handling circuits to communicate/route signals from within the active area to outside of the active area.

2. The optical device of claim 1, wherein the plurality of data-handling circuits is-formed on the semiconductor chip is configured to route signals to and/or from the plurality of electro-optical circuits.

3. An optical device comprising:
    a semiconductor chip having a first surface that receives direct-view light and transmits the direct-view light through transparent regions; and
    a plurality of electro-optical circuits formed on the semiconductor chip, the plurality of electro-optical circuits comprising light emitters spanning an active area that extends to one or more edges of the semiconductor chip, the light emitters configured to output display light, and the transparent regions being arranged between respective light emitters,
    wherein the plurality of data-handling circuits formed on the semiconductor chip is configured to route signals to and/or from the plurality of electro-optical circuits, and
    wherein a plurality of display-control circuits is formed in a first fabrication layer of the semiconductor chip, the plurality of display-control circuits being formed within the active area, and the first fabrication layer being below a plurality of emitters, when observed from a top-down view.

4. The optical device of claim 3, wherein the plurality of data-handling circuits is fabricated in a second fabrication layer of the semiconductor chip, the second fabrication layer being different than the first fabrication layer, and the plurality of data-handling circuits being arranged outside of an optical path of rays of the direct-view light passing through the transparent regions.

5. The optical device of claim 3, wherein the plurality of data-handling circuits is fabricated below plurality of electro-optical circuits, when observed from the top-down view.

6. The optical device of claim 2, wherein the plurality of data-handling circuits is fabricated in a second fabrication layer of the semiconductor chip, the second fabrication layer being different than the first fabrication layer.

7. The optical device of claim 3, wherein the plurality of data-handling circuits is fabricated in a second fabrication layer of the semiconductor chip, the second fabrication layer being a same fabrication layer as the first fabrication layer.

8. The optical device of claim 2, wherein the plurality of data-handling circuits includes one or more circuits selected from a group of an image data pipeline circuit, a global configuration circuit, an analog reference block circuit, a display data pipeline circuit, a line driver circuit, and a column driver circuit.

9. The optical device of claim 2, wherein the plurality of data-handling circuits include an analog-to-digital signal converter and/or a digital-to-analog signal converter.

10. The optical device of claim 3, wherein the plurality of display-control circuits includes photodetectors, and the data-handling circuits being configured to readout signals from the photodetectors.

11. The optical device of claim 2, wherein
    a plurality of display-control circuits is configured to route signals to the plurality of electro-optical circuits,
    a direct-view imager that generates the direct-view light image, the direct-view light image representing an intensified image, and
    the semiconductor chip superimposes a display image over the intensified image, the semiconductor chip overlapping a part of a cross-sectional area of an optical path of the intensified image, and the display image superimposed only on the part of the cross-sectional area of the intensified image.

12. An optical device comprising:
    a semiconductor chip having a first surface that receives direct-view light and transmits the direct-view light through transparent regions;
    a plurality of electro-optical circuits formed on the semiconductor chip, the plurality of electro-optical circuits comprising light emitters spanning an active area that extends to one or more edges of the semiconductor chip, the light emitters configured to output display light, and the transparent regions being arranged between respective light emitters; and
    a direct-view imager that generates the direct-view light image, the direct-view light image representing an intensified image, wherein
    the semiconductor chip superimposes a display image over the intensified image, the semiconductor chip partially overlapping a cross-sectional area of an optical path of the intensified image, the display image being superimposed only on a part of the intensified image, and the active area extending to an edge of the semiconductor chip that passes through an interior of the cross-sectional area of the optical path of the intensified image.

13. The optical device of claim 1, further comprising:
    an intensifier that generates the direct-view light, the intensifier comprising:
    a photocathode configured to receive imaged light from an objective and emit electrons in response to the imaged light;

a multiplier configured to receive electrons emitted from the photocathode and to multiply a number of the electrons, generating multiplied electrons; and a phosphor screen that receives the multiplied electrons and in response emits the direct view light, the direct view light representing an intensified image.

14. A method of processing light in an intensifier module of an optical device, the method comprising:

receiving, at an intensifier, the light from an environment and generating intensified light representing an intensified image of the environment;

transmitting the intensified light through a transparent overlay display; and emitting display light from the transparent overlay display, the display light superimposing a display image over the intensified image, the transparent overlay display comprising:

a semiconductor chip having a first surface that receives intensified light and transmits the intensified light through transparent regions of the optical device, a plurality of electro-optical circuits formed on the semiconductor chip, the plurality of electro-optical circuits comprising light emitters spanning an active area that extends to one or more edges of the semiconductor chip, the light emitters configured to output the display light, and the transparent regions being arranged between respective light emitters of the light emitters, and a plurality of data-handling circuits formed on the semiconductor chip, wherein at least one of the plurality of data-handling circuits comprises an edge adjacent to an edge of the active area permitting the at least one of the plurality of data-handling circuits to communicate/route signals from within the active area to outside of the active area.

15. The method of claim 14, further comprising routing signals to and/or from pixels of the transparent overlay display using the plurality of data-handling circuits formed on the semiconductor chip.

16. A method of processing light in an intensifier module of an optical device, the method comprising:

receiving, at an intensifier, the light from an environment and generating intensified light representing an intensified image of the environment;

transmitting the intensified light through a transparent overlay display;

emitting display light from the transparent overlay display, the display light superimposing a display image over the intensified image, the transparent overlay display comprising:

a semiconductor chip having a first surface that receives intensified light and transmits the intensified light through transparent regions of the optical device, and a plurality of electro-optical circuits formed on the semiconductor chip, the plurality of electro-optical circuits comprising light emitters spanning an active area that extends to one or more edges of the semiconductor chip, the light emitters configured to output the display light, and the transparent regions being arranged between respective light emitters of the light emitters;

routing signals to and/or from pixels of the transparent overlay display using the plurality of data-handling circuits formed on the semiconductor chip; and controlling an intensity of the display light using a plurality of display-control circuits formed in a first fabrication layer of the semiconductor chip, wherein the plurality of display-control circuits is formed within the active area, and the first fabrication layer is below a plurality of emitters, when observed from a top-down view.

17. The method of claim 16, wherein the plurality of data-handling circuits, which routes the signals to and/or from the pixels, is fabricated in a second fabrication layer of the semiconductor chip, the second fabrication layer being different than the first fabrication layer, and the plurality of data-handling circuits are arranged outside of an optical path of rays of the intensified light passing through the transparent regions.

18. A method comprisingof processing light in an intensifier module of an optical device, the method comprising:

receiving, at an intensifier, the light from an environment and generating intensified light representing an intensified image of the environment;

transmitting the intensified light through a transparent overlay display;

emitting display light from the transparent overlay display, the display light superimposing a display image over the intensified image, the transparent overlay display comprising:

a semiconductor chip having a first surface that receives intensified light and transmits the intensified light through transparent regions of the optical device, and a plurality of electro-optical circuits formed on the semiconductor chip, the plurality of electro-optical circuits comprising light emitters spanning an active area that extends to one or more edges of the semiconductor chip, the light emitters configured to output the display light, and the transparent regions being arranged between respective light emitters of the light emitters;

routing signals to and/or from pixels of the transparent overlay display using a plurality of data-handling circuits formed on the semiconductor chip; and detecting an intensity of the intensified light using photodetectors, the plurality of electro-optical circuits including the photodetectors and the plurality of data-handling circuits is configured to readout signals from the photodetectors.

19. The method of claim 16, wherein the plurality of data-handling circuits, which routes the signals to and/or from the pixels, is fabricated in the first fabrication layer, and the plurality of data-handling circuits are arranged outside of a optical path of rays of the intensified light passing through the transparent regions.

20. A method of processing light in an intensifier module of an optical device, the method comprising:

receiving, at an intensifier, the light from an environment and generating intensified light representing an intensified image of the environment;

transmitting the intensified light through a transparent overlay display; and emitting display light from the transparent overlay display, the display light superimposing a display image over the intensified image, the transparent overlay display comprising:

a semiconductor chip having a first surface that receives intensified light and transmits the intensified light through transparent regions of the optical device, and a plurality of electro-optical circuits formed on the semiconductor chip, the plurality of electro-optical circuits comprising light emitters spanning an active area that extends to one or more edges of the semiconductor chip, the light emitters configured to output the display light, and the transparent regions being arranged between respective light emitters of the light emitters, wherein the emitting the display light from the transparent overlay display further comprises that the transparent overlay display superimposes the display image over a part of the intensified image, the semiconductor chip partially overlapping a cross-sectional area of an optical path of the intensified image, the display image being superimposed only on the part of the intensified image, and the active area extending to an edge of the semiconductor chip that passes through an interior of the cross-sectional area of the optical path of the intensified image.

\* \* \* \* \*